(12) United States Patent
Plow et al.

(10) Patent No.: US 6,498,491 B2
(45) Date of Patent: Dec. 24, 2002

(54) BATTERY MONITORING SYSTEM

(75) Inventors: William R. Plow, Sheffield Lake, OH (US); William C. Colley, III, Oberlin, OH (US); Dale B. Garret, Sheffield Lake, OH (US); David F. Essi, III, Lorain, OH (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/766,351

(22) Filed: Jan. 19, 2001

(65) Prior Publication Data

US 2002/0021131 A1 Feb. 21, 2002

Related U.S. Application Data

(60) Provisional application No. 60/202,592, filed on May 9, 2000.

(51) Int. Cl.[7] .............................................. G01N 27/416
(52) U.S. Cl. ....................................... 324/426; 320/132
(58) Field of Search .................................. 324/426, 427, 324/429; 320/132, 134, 136, 116

(56) References Cited

U.S. PATENT DOCUMENTS

| | | | |
|---|---|---|---|
| 4,307,330 A | 12/1981 | Belot | 320/134 |
| 5,047,961 A | 9/1991 | Simonsen | 320/150 |
| 5,574,355 A | 11/1996 | McShane et al. | 320/161 |
| 5,592,093 A | 1/1997 | Klingbiel | 324/426 |
| 5,705,929 A | * 1/1998 | Caravello et al. | 324/430 |
| 5,757,192 A | 5/1998 | McShane et al. | 324/427 |
| 5,821,756 A | 10/1998 | McShane et al. | 324/430 |
| 5,831,435 A | 11/1998 | Troy | 324/426 |
| 5,914,605 A | 6/1999 | Bertness | 324/430 |
| 5,945,829 A | 8/1999 | Bertness | 324/430 |
| 6,094,030 A | * 7/2000 | Gunthorpe et al. | 320/116 |

FOREIGN PATENT DOCUMENTS

| | | |
|---|---|---|
| FR | 2754395 | 10/1998 |
| WO | WO 9927628 | 6/1999 |
| WO | WO 0005596 | 2/2000 |

OTHER PUBLICATIONS

Anbuky, et al "VRLA Battery Capacity Measurement and Discharge Reserve Time Prediction", 1998 pp. 302–310, XP–002148505.

Noworolski et al "A Microcomputer–Based Battery Management System", Intelec '91 (Nov., 1991), pp. 177–180, XP–000314577.

* cited by examiner

Primary Examiner—Edward H. Tso
Assistant Examiner—Lawrence Luk
(74) Attorney, Agent, or Firm—Jones, Day, Reavis & Pogue

(57) ABSTRACT

A power distribution system is provided comprising a power regulator, a battery circuit, and a battery monitoring system. The power converter is provided for converting AC power to DC power and for providing DC power to a load. The battery circuit is coupled to the power regulator and the load and is operable to recharge by receiving DC power from the power regulator. The battery circuit is also operable to supply DC power to the load when there is an interruption of power from the load. The battery monitoring system comprises a field measurement device located in close proximity to the battery circuit, the field measurement device including an input mechanism for receiving current measurement data and an analog-to-digital converter for digitizing the received current measurement data. The battery monitoring system further comprises a monitor located remotely from the field measurement device, the monitor including a first communicator for receiving digitized data from the field measurement device.

74 Claims, 3 Drawing Sheets

BATTERY MONITORING SYSTEM

CROSS-REFERENCES TO RELATED APPLICATIONS

This application claims priority from the following application:

U.S. Application No. 60/202,592, filed May 9, 2000.

FIELD OF THE INVENTION

The present invention relates to the field of battery monitoring systems. In particular, the present invention relates to battery monitoring systems that are capable of measuring battery float current levels.

BACKGROUND OF THE INVENTION

In the telecommunications industry, battery strings are typically used as back-up power sources for telecommunication loads. Telecommunication loads are normally powered by an AC to DC converter. If, however, there is an AC power outage, the battery strings deliver power to the load so that telecommunication services are not interrupted.

To ensure that the battery strings are in sufficient condition to supply power to the load when needed, battery string state-of-health indicators are monitored. One state-of-health indicator that has been found to be particularly useful to monitor is the float current for each battery string. The battery charge/discharge current is typically determined by measuring the voltage across a resistive shunt that is connected in series between the battery string and the load. The present invention provides circuitry capable of measuring the battery float current from the same shunt used to measure the battery charge and discharge currents.

The magnitude of the current flowing through the shunt can vary between large positive and negative readings (charge and discharge respectively) depending on whether the battery is discharging to provide power to the load, recharging after it has provided power to the load, or sitting in a fully charge state with only float currents flowing. A float current may be as small as 0.1% of a battery shunt's rated current capacity. Because the battery current is generally calculated by measuring the voltage across the shunt and the typical shunt yields 50 mV when the fall rated current is flowing through the shunt and only 50 $\mu$V when 0.1% rated current is flowing through the shunt, a measuring device having high precision, accuracy, and resolution is needed to measure the current.

Present systems for measuring float current include hand-held float current measurement devices that are capable of measuring currents only from about 0.01 A to 200 A with a response time of 2 to 7 minutes. These devices are disadvantaged in that their range may not be capable of measuring the larger charge and discharge currents and the smaller float currents, require a human operator to manually take measurements, are not capable of distinguishing a float current from a small charge current, and consequently require a human operator to manually enter data if trends are to be monitored.

Other systems for measuring float current include Hall effect devices. The major shortcoming of Hall effect devices is offset error. Hall effect devices sized to read the charge and discharge current levels are not capable of reading the float current at all due to the 1–2% offset error which makes the float current reading undetectable. Hall effect devices sized to read the float current level saturate at the larger charge and discharge current levels, which makes the charge and discharge readings undetectable. As a result, the Hall effect device has insufficient resolution for this application.

Closed loop Hall effect with proper supporting circuitry are capable of reading the charge, discharge and float currents but are cost prohibitive at this time.

Present systems are not capable of distinguishing a float current reading from a small charge current.

Therefore, there remains a need for a float current monitoring system that has the precision, accuracy and resolution to measure battery float current as well as discharge and charge currents. There remains a particular need for a float current monitoring system that is capable of making the measurements without human intervention possessing the capability to distinguish a float current from a small charge current and record historical data.

SUMMARY OF THE INVENTION

The present invention meets the foregoing needs by providing a battery monitoring system for monitoring the state-of-health of batteries in a power distribution system. The preferred system is capable of measuring battery currents ranging from full charge to full discharge with a resolution capable of reading float current levels. The preferred system includes a software algorithm that determines when the battery string is drawing a float charge. When the preferred system determines that it is measuring float current, the preferred system is capable of providing a notification via visual, audible, or remote reporting that float currents are out specification in accordance with user configured alarm thresholds. The preferred system is also capable of recording historical data for use in calculating daily, weekly, or monthly float current averages.

The present invention provides many advantages over the presently known float current monitoring systems. Not all of these advantages are simultaneously required to practice the invention as claimed, and the following list is merely illustrative of the types of benefits that may be provided, alone or in combination, by the present invention. These advantages include: (1) the system's automatic operation; (2) the lack of a need for a human operator to take measurements; and (3) the systems flexibility in being easily configurable to take measurements from shunts having different capacities.

In accordance with one aspect of the present invention, a battery monitoring system is provided that comprises a field measurement device and a monitor. The field measurement device is located in close proximity to a battery to be monitored. The field measurement device includes an input mechanism for receiving current measurement data and an analog-to-digital converter for digitizing the received current measurement data. The monitor is located remotely from the field measurement device. The monitor includes a communicator for receiving digitized data from the field measurement device.

In accordance with another aspect of the present invention, a power distribution system is provided comprising a power regulator, a battery circuit, and a battery monitoring system. The power regulator is provided for converting AC power to DC power and for providing DC power to a load. The battery circuit is coupled to the power regulator and the load and is operable to recharge by receiving DC power from the power regulator. The battery circuit is also operable to supply DC power to the load when there is an interruption of power from the load. The battery monitoring system comprises a field measurement device located in close proximity to the battery circuit, the field measurement device including an input mechanism for receiving current measurement data and an analog-to-digital converter for digitizing the received current measurement data. The battery monitoring system further comprises a monitor located remotely from the field measurement device, the monitor including a first communicator for receiving digitized data from the field measurement device.

In accordance with another aspect of the present invention, a battery monitor for use in a power distribution system is provided. The battery monitor comprises a monitor CPU for monitoring the state of health of a battery in the power distribution system and a shunt interface circuit having a first communicator and a shunt interface controller, the first communicator being operable to communicate with a field measurement device located in close proximity to the battery, the field measurement device being operable to communicate state-of-health information regarding the battery, and the shunt interface controller being operable to communicate the state-of-health information to the monitor CPU.

In accordance with another aspect of the present invention, a field measurement device for use in a power distribution system is provided. The field measurement device comprises an input mechanism for measuring battery state-of-health information regarding a battery, an analog-to-digital converter for digitizing the measured battery state-of-health information, and a communicator for communicating the digitized battery state-of-health information to a remotely located battery monitor.

In accordance with another aspect of the present invention, a method for remotely monitoring the state-of-health of a plurality of batteries in a power distribution system is provided. The method comprises the steps of providing a plurality of plurality of field measurement devices, each device being in close proximity to one of the batteries, performing a battery state-of-health measurement on at least one of the batteries, communicating the battery state-of-health information to a monitoring system; and displaying information regarding the state-of-health of the battery at the monitoring system.

BRIEF DESCRIPTION OF DRAWINGS

The present invention will become more apparent from the following description when read in conjunction with the accompanying drawings wherein.

DETAILED DESCRIPTION OF THE PREFERRED EMBODIMENTS

Figure 1:
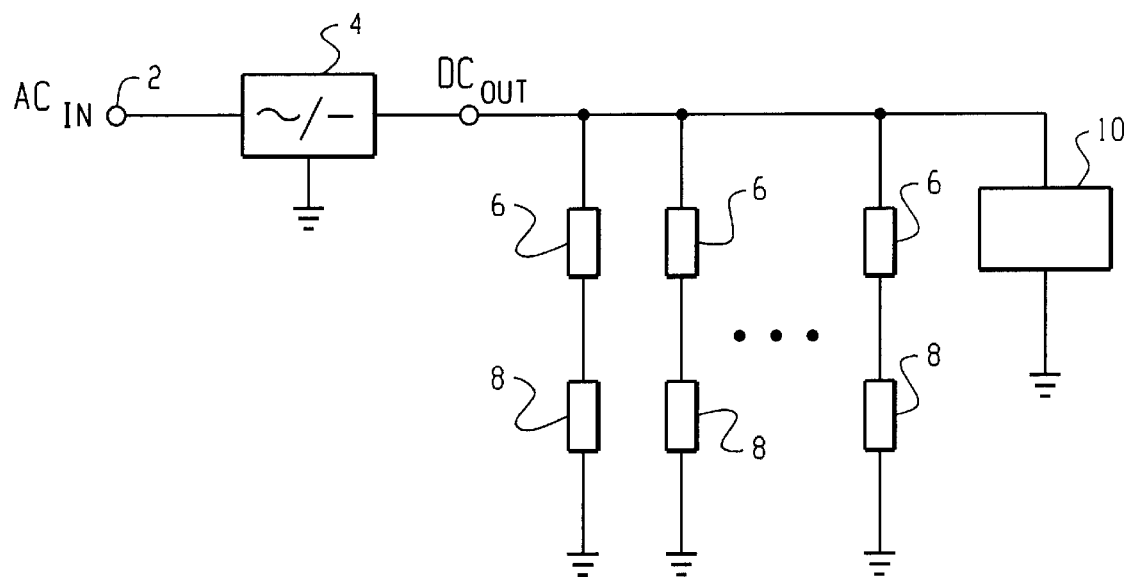
FIG. 1 is a simplified schematic view of an exemplary telecommunication system in which the present invention is useful.

Referring now to the figures, FIG. 1 sets forth a schematic view of an exemplary power plant for a telecommunication system in which the present invention is particularly useful. AC power is supplied via a terminal 2 to a power regulator 4 that converts the AC power to D.C. power. The D.C. power leaving the power regulator 4 is coupled to the load 10 to provide power thereto. The system also includes a plurality of battery strings 8 that are coupled in parallel to the load 10. The battery strings 8 function as an Uninterruptable Power Supply ("UPS") and provides power to the load 10 when there is an interruption in the power from the power regulator 4. When the power regulator 4 provides power to the load 10, the power regulator 4 also provides power to the battery strings 8 to charge the battery strings 8 if they are partially or fully discharged. The power regulator 4 also provides a charge to the battery strings 8 that generates a float current in the battery strings 8 to counteract self discharging currents. Coupled between each battery strings 8 on one end and the load 10 and power regulator 4 on the other end is a shunt 6. The shunt 6 preferably is a resistive device through which current flows to or from the battery string 8. The shunt 6 provides a convenient place at which to measure battery string current flow.

To ensure that the battery strings 8 are in suitable condition to supply power to the load 10 when needed, battery string state-of-health indicators typically are monitored. One state-of-health indicator that has been found to be particularly useful to monitor is the battery string float current. The battery float current is determined, in the present invention, by measuring the voltage across the resistive shunt 6.

The current that flows through the shunt 6 can vary with large negative and positive values depending on the battery string state, i.e., whether the battery string is discharging to provide power to the load, recharging after it has provided power to the load, or in a fully charge state with only float currents flowing.

Figure 2:
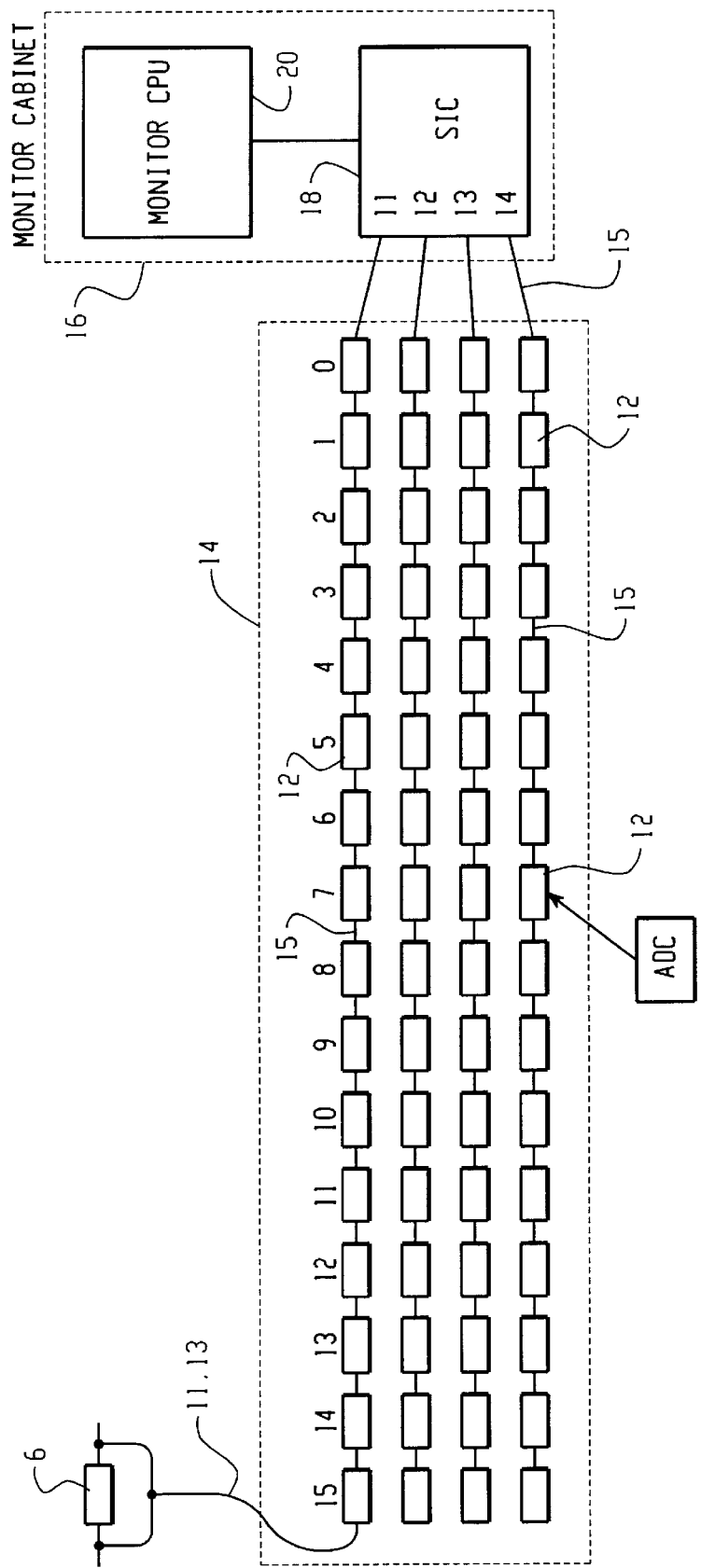
FIG. 2 is a schematic view of a preferred system implementation of the present invention.

Now referring to FIG. 2, shown is a preferred embodiment of a system 1 according to the present invention for measuring float current. The system 1 is capable of measuring battery currents ranging from full charge to full discharge with a resolution capable of reading float current levels. The system 1 comprises a current measurement block 14 and a monitor block 16. The preferred current measurement block 14 includes a plurality of Analog-to-digital cards (ADCs) 12, preferably 24-bit ADCs, that are capable of measuring small voltages proportional to charge/discharge/float current through the resistive shunt 6 in series with a battery string 8. Each ADC 12 is preferably remotely located next to the shunt 6 it is monitoring and communicates with other ADCs via a serial communication path 15 and ultimately with a Shunt Interface Card (SIC) 18 located in the Monitor 16.

The Monitor 16 includes at least one SIC 18. The SIC 18 allows the system to read data from a single or multiple ADCs 12. In the embodiment shown, the SIC 18 allows the system to read data from up to four groups of ADCs 12 with each group preferably containing sixteen ADCs 12. In addition to providing a means of concentrating ADC readings, the SIC 18 is capable of filtering the readings before providing them to Monitor firmware that Monitor CPU 20 within the monitor 16 executes. The Monitor 16 also includes a software algorithm that determines if the battery string 8, whose current is being measured, is only drawing a float charge. Once the float condition is detected, alarms, preferably having user configurable thresholds, can alert a user to float currents out of specification via visual, audible, or remote reporting. The Monitor CPU 20 can also record historical data to allow monitoring of daily, weekly, and monthly averages of float currents.

The system 1 according to the present invention allows a user to monitor the charge, discharge, and float currents of a battery plant having multiple battery strings located at different places in the plant from a single measurement device. Further, a user can determine the age and state of health of the battery plant with the historical data provided as well as receive remote reports when the float current is above or below user configured thresholds.

Referring back to the current measurement block 14, the current measurement block 14 includes at least one ADC 12 which measures the current flowing through a shunt 6. In the embodiment shown, the current measurement block 14 includes four rows of sixteen ADC circuits 12 each. Each ADC circuit 12 includes a set of wires 11, 13 for connection across a shunt 6. The wires 11, 13 measure the D.C. voltage across the shunt 6, which is proportional to the D.C. current flowing through the resistive shunt 6. The ADC 12 is preferably remotely located next to the shunt 6 to minimize the distance the current measurement signal has to travel to be processed thereby reducing the effect of noise on measurements.

The ADCs 12 are preferably serially connected in the field to form a communication path 15 to transmit measurement information from one ADC 12 to another down the path 15 in a bucket brigade manner until the information reaches the SIC 18. The communication path 15 allows multiple ADCs to communicate with a SIC 18 using a shared communication path thereby minimizing the number of communication paths 15 needed by the monitor 16 and increasing the system's 1 ability to monitor multiple battery strings 8. The ADC 12 also can be configured to receive power directly from the battery string 8 it is monitoring so that a separate power source is not needed to power the components within the ADC 12.

Figure 3:
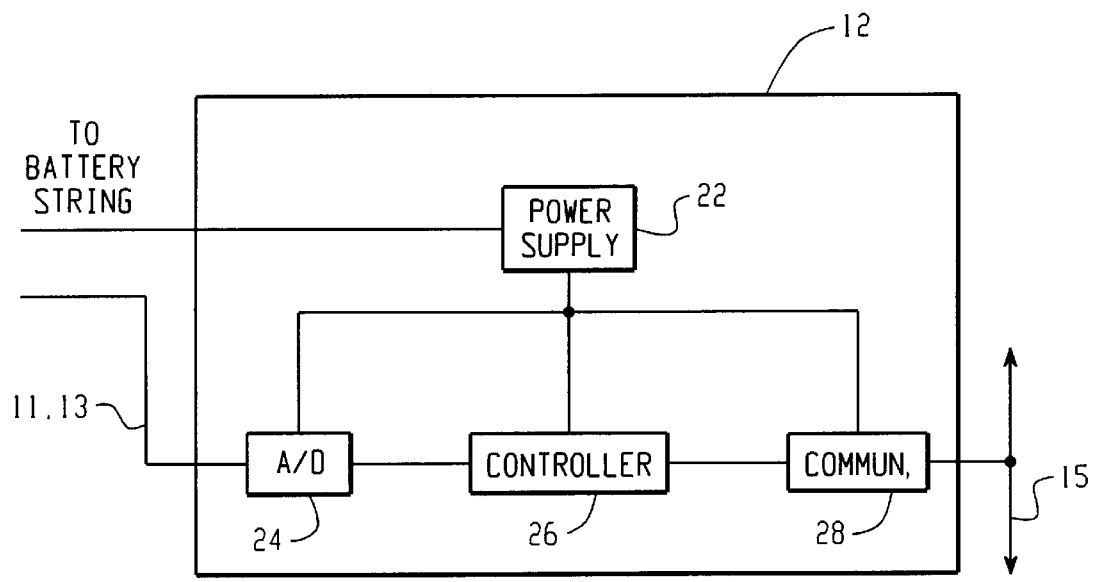
FIG. 3 is a block diagram of a preferred Analog-to-digital measurement circuit according to the present invention.

As best seen in FIG. 3, the preferred ADC 12 comprises a power supply 22, a 24-bit analog-to-digital converter (A/D Converter) 24, a micro-controller 26, and a communications circuit 28. The power supply 22 preferably receives input power from the monitored battery string 8 and converts it to power levels usable by the other components within the ADC 12.

Because float current is several orders of magnitude less than a battery's rated discharge current, the resolution of the A/D measurements must be fine. Due to the need for fine resolution, noise is a major design constraint, as well as the introduction of gain errors and offset drifts due to slight variations of the ambient temperature. One aspect of the present invention removes these constraints by preferably providing the ADC close to the battery string so that the monitored signals can be digitized without first being amplified or transmitted long distances whereby noise could be introduced. Also, a low drift, low noise voltage reference is preferably used.

The preferred A/D converter 24 provides 21.6 effective bits of resolution and accepts input voltages in the desired range of ±50 m VDC from wires 11, 13 connected to shunt 6 without the need for a pre-amplifier stage. The converter 24 operates from a single 5.0 VDC supply. An on-board DC-DC converter provides electrical isolation as well as the necessary supply voltage. The ADC 12 uses a 5.0V zener-based reference with a tolerance of 0.05% and a maximum drift of 5 ppm/° C. This translates to a calculated error of 0.03% over the entire operating range based on calibration performed at room temperature. The A/D converter 24 digitizes the analog shunt voltages and passes the digitized values to the micro-controller 26.

The micro-controller 26 is responsible for extracting raw digitized data from the A/D Converter 24 and converting it to engineering units. The correct gain factor is selected based, preferably, on the position of a rotary DIP switch located on the ADC 12 that indicates the capacity of the shunt 6 that is monitored. This allows the ADC 12 to be used with shunts 6 having different capacities. The micro-controller 26 also performs simple filtering to eliminate slight variations in the input signal. The micro-controller 26 also controls the communication circuit 28 to maintain the data flow along the communications path 15. The micro-controller 26, after converting the digitized data, transfers it to the communication circuit 28 for transmission of the digitized data to the SIC 18. The micro-controller 26 could comprise any number of devices and is preferably Microchip Technology PIC16C621.

The communication circuit 28 is designed to communicate with other communication circuits 28 on other ADCs 12 and with the SIC 18. The communication circuit 28 allows multiple ADCs 12 to be serially connected to transmit data from one ADC 12 to another along a single communication path 15 to the SIC 18. The communication circuit 28 transmits digitized data from its ADC 12 to the communication path 15 and passes digital data transmitted from other ADCs 12 down the communication path 15. The communication circuit could comprise a number of different devices capable of transmitting data down the communication path including but limited to devices capable of using TCP/IP, LONWORKS, CAN, Firewire, USB, Infrared, fiber optics, RF links, and other digital communication means to transmit data.

Figure 4:
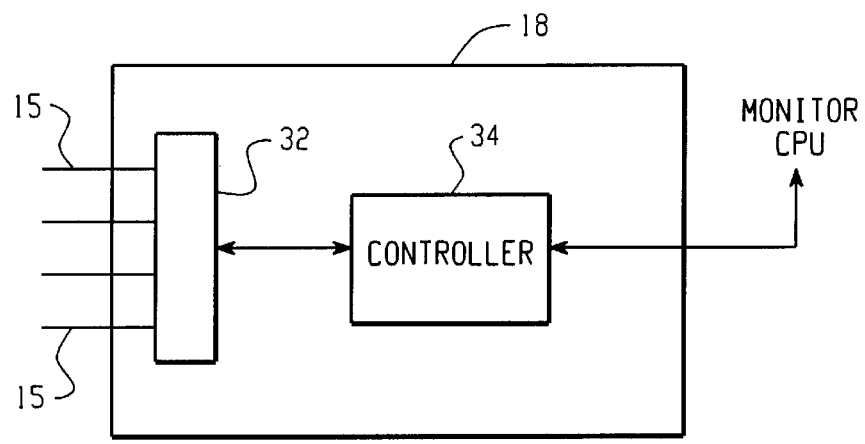
FIG. 4 is a block diagram of a Shunt Interface Card according to the present invention.

Referring now to FIG. 4, the SIC 18 comprises a SIC communicator 32 and a SIC controller 34. In the embodiment shown, the SIC communicator 32 is capable of retrieving digitized ADC data from four ADC communication paths 15 with each path 15 servicing sixteen ADCs. The SIC communicator 32 transmits the ADC data to the SIC controller 34. The SIC controller 34 performs a concentrator function for transferring ADC data to the monitor CPU 20. The SIC controller 34 provides the user with a means for selecting multiple levels of filtering of readings from the ADC 12 before providing them to the monitor CPU 20 and firmware.

The monitor CPU 20 includes a software algorithm that determines when the battery string 8 in a power plant is only drawing a float charge. Once the float condition is detected, user configured alarm thresholds can be provided to alert a user that float currents are out of specification via visual, audible, or remote reporting. Historical data can be recorded for daily, weekly, and monthly float current averaging.

The monitor CPU 20 can detect whether the current being measured is indeed a float current versus a charge or discharge current. The monitor CPU 20 also provides alarms, reports, and historical data for detecting trends that indicate the age and state-of-health of the monitored battery strings 8.

Figure 5:
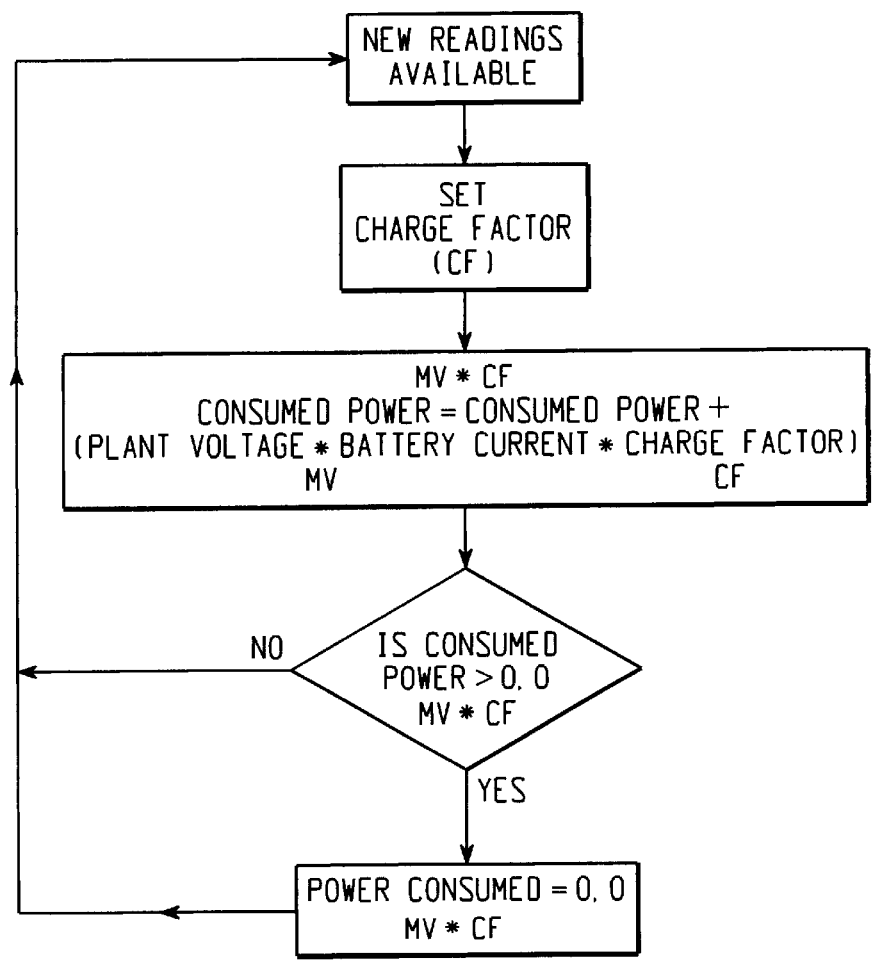
FIG. 5 is a flow chart depicting a float current detection algorithm according to the present invention.

The float current detection algorithm of the monitor CPU 20 functions as illustrated in FIG. 5. When a battery current indicates that a monitored battery string 8 in a state of discharge (negative current reading), the monitor CPU 20 begins to store a measurement value MV that represents the total power discharged from the battery and multiplies this value by a charge factor CF. The resulting value MV*CF is also stored. An increasingly large negative value MV*CF is stored because the discharge current is negative. When the current indicates that the monitored battery string 8 is in a charge state (positive current reading), the monitor CPU 20 begins to increase the stored value MV*CF that represents the total power discharged. When the total power consumed value MV*CF becomes greater than zero, the value MV*CF is set to exactly zero and the monitor CPU 20 indicates that the monitored battery current is a float current. The purpose of the charge factor CF is to provide a means for ensuring that the amount of energy returned to the battery string 8 is greater than the energy removed from the battery string 8. The charge factor CF can be determined by the expected characteristics of the battery and it should be greater than 1.0. The charge factor can also be set to a value of 1.0 or another value by the user.

The present invention has been described with reference to a power plant for a telecommunication system. It would be obvious, however, to those skilled in the art to apply the invention to other systems without departing from the spirit of the invention. Having described in detail the preferred embodiment of the present invention, including preferred modes of operation, it is to be understood that the present invention could be carried out with different elements and steps. The preferred embodiment is presented only by way of example and is not meant to limit the scope of the present invention, which is defined by the following claims.

What is claimed is:

1. A battery monitor for use in a power distribution system, the battery monitor comprising:
    a monitor CPU for monitoring the state of health of a battery in the power distribution system; and
    a shunt interface circuit having a first communicator and a shunt interface controller, the first communicator being operable to communicate with a field measurement device located in close proximity to the battery, the field measurement device being operable to communicate state-of-health information regarding the battery, and the shunt interface controller being operable to communicate the state-of-health information to the monitor CPU.

2. The monitor according to claim 1 wherein the shunt interface controller filters the information from the field measurement device.

3. The monitor according to claim 1 wherein the monitor is operable to execute an algorithm to determine if the field measurement device is measuring the float current of the battery.

4. The monitor according to claim 3 wherein the algorithm requires the monitor CPU to compute a measurement value that represents the total power discharged from the battery.

5. The monitor according to claim 4 wherein the algorithm requires the monitor CPU to multiply the measurement value by a charge factor.

6. The monitor according to claim 5 wherein the charge factor is greater than or equal to the value one.

7. The monitor according to claim 1 wherein the first communicator is coupled to a plurality of field measurement devices coupled in series via a communication path.

8. The monitor according to claim 1 wherein the first communicator is coupled to a plurality of communication paths, each communication path including a plurality of field measurement devices coupled in series via the communication path.

9. A field measurement device for use in a power distribution system, the field measurement device comprising:
    an input mechanism for measuring battery state-of-health information regarding a battery;
    an analog-to-digital converter for digitizing the measured battery state-of-health information; and
    a communicator for communicating the digitized battery state-of-health information to a remotely located battery monitor.

10. The device according to claim 9 further comprising a controller for controlling the operation of the analog-to-digital converter and for controlling the operation of the communicator.

11. The device according to claim 10 further comprising a power supply coupled to receive input power from the battery, the power supply being operable to supply power to the analog-to-digital converter, the controller, and to the communicator.

12. The device according to claim 10 further comprising a power supply coupled to receive input power from the battery, the power supply being operable to supply power to the analog-to-digital converter and to the communicator.

13. The device according to claim 10 further comprising input means for measuring the current flowing through the battery.

14. The device according to claim 13 wherein the input means is coupled across a shunt that is in series with the battery.

15. The device according to claim 9 wherein the communicator is coupled to a second communicator in a second field measurement device.

16. The device according to claim 9 wherein the communicator communicates with the battery monitor via digital communications means.

17. A method for remotely monitoring the state-of-health of a plurality of batteries in a power distribution system comprising the steps of:
    providing a plurality of field measurement devices, each device being in close proximity to one of the batteries;
    performing a battery state-of-health measurement on at least one of the batteries;
    communicating the battery state-of-health information to a monitoring system; and
    displaying information regarding the state-of-health of the battery at the monitoring system.

18. The method of claim 17 wherein the communicating step comprises communicating the state-of-health information measured by a first field measurement device to a second field measurement device and then to the monitoring system.

19. A battery monitoring system for measuring battery float current comprising:
    a field measurement device located in close proximity to a battery, the device including battery state-of-health measurement means for acquiring state-of-health information regarding the battery, the device further including communication means for communicating state-of-health information regarding the battery; and
    a monitor located remotely from the field measurement device, the monitor including communicator means for receiving state-of-health information regarding the battery from the field measurement device, the monitor further including means for displaying state-of-health information regarding the battery.

20. The system according to claim 19 wherein the monitor further includes means for determining whether the state-of-health information received is a battery float current measurement.

21. The system according to claim 19 wherein the battery state-of-health measurement means comprises an analog-to-digital converter.

22. The system according to claim 19 wherein the battery state-of-health measurement means measures current flowing through the battery.

23. A battery monitoring system for measuring battery float current comprising:

a field measurement device located in close proximity to a battery string, the field measurement device being operative to receive current measurement data from the battery string, the field measurement device comprising an analog-to-digital converter for digitizing the received current measurement data, the field measurement device further comprising a second communicator for transmitting digitized data from the field measurement device to a monitor, the field measurement device also comprising a controller for providing control signals to at least one of the analog-to-digital converter and the second communicator, the field measurement device further comprising a power supply for receiving an input voltage from the battery string and for providing an output voltage to at least one of the controller, the second communicator, and the analog-to-digital converter; and the monitor, which is located remotely from the field measurement device, the monitor including a first communicator for receiving the digitized data from the field measurement device.

24. The system according to claim 23 wherein the second communicator is operable to receive digitized data from a second field measurement device and is operable to transmit the digitized data from the second field measurement device to the monitor.

25. The system according to claim 23 wherein the monitor comprises a shunt interface circuit that includes the first communicator.

26. The system according to claim 25 wherein the shunt interface circuit further comprises a shunt interface controller.

27. The system according to claim 26 wherein the shunt interface controller filters readings from the field measurement device.

28. The system according to claim 23 wherein the monitor further comprises a monitor CPU.

29. The system according to claim 28 wherein the monitor is operable to execute an algorithm to determine if the field measurement device is measuring the float current of the battery.

30. The system according to claim 29 wherein the algorithm requires the monitor CPU to compute a measurement value that represents the total power discharged from the battery.

31. The system according to claim 29 wherein the algorithm requires the monitor CPU to multiply the measurement value by a charge factor.

32. The system according to claim 31 wherein the charge factor is greater than or equal to the value one.

33. A battery monitoring system for measuring battery float current comprising:

a field measurement device located in close proximity to a battery, the field measurement device being operative to receive current measurement data and including an analog-to-digital converter for digitizing the received current measurement data; and a monitor located remotely from the field measurement device, the monitor comprising a shunt interface circuit that includes a first communicator, the first communicator being operable to receive digitized data from the field measurement device.

34. The system according to claim 33 wherein the shunt interface circuit further comprises a shunt interface controller.

35. The system according to claim 34 wherein the shunt interface controller filters the digitized data from the field measurement device.

36. The system according to claim 33 wherein the field measurement device further comprises a second communicator for transmitting the digitized data from the field measurement device to the monitor.

37. The system according to claim 36 wherein the second communicator is operable to receive digitized data from a second field measurement device and is operable to transmit the digitized data from the second field measurement device to the monitor.

38. The system according to claim 33 wherein the monitor further comprises a monitor CPU.

39. The system according to claim 38 wherein the monitor is operable to execute an algorithm to determine if the field measurement device is measuring the float current of the battery.

40. The system according to claim 39 wherein the algorithm requires the monitor CPU to compute a measurement value that represents the total power discharged from the battery.

41. The system according to claim 40 wherein the algorithm requires the monitor CPU to multiply the measurement value by a charge factor.

42. The system according to claim 41 wherein the charge factor is greater than or equal to the value one.

43. The system according to claim 38 wherein the shunt interface circuit filters the digitized data from the field measurement device and passes the filtered digitized data to the monitor CPU.

44. A battery monitoring system for measuring battery float current comprising:

a field measurement device located in close proximity to a battery, the field measurement device being operative to receive current measurement data and including an analog-to-digital converter for digitizing the received current measurement data; and a monitor located remotely from the field measurement device, the monitor including a first communicator for receiving digitized data from the field measurement device and a monitor CPU, the monitor being operable to execute an algorithm to determine if the field measurement device is measuring the float current of the battery.

45. The system according to claim 44 wherein the algorithm requires the monitor CPU to compute a measurement value that represents the total power discharged from the battery.

46. The system according to claim 45 wherein the algorithm requires the monitor CPU to multiply the measurement value by a charge factor.

47. The system according to claim 46 wherein the charge factor is greater than or equal to the value one.

48. The system according to claim 44 wherein the field measurement device further comprises a second communicator for transmitting the digitized data from the field measurement device to the monitor.

49. The system according to claim 48 wherein the second communicator is operable to receive digitized data from a second field measurement device and is operable to transmit the digitized data from the second field measurement device to the monitor.

50. The system according to claim 44 wherein the monitor further comprises a shunt interface circuit that includes the first communicator.

51. The system according to claim 50 wherein the shunt interface circuit further comprises a shunt interface controller.

52. The system according to claim 51 wherein the shunt interface controller filters readings from the field measurement device.

53. The system according to claim 52 wherein the shunt interface controller passes the filtered digitized data to the monitor CPU.

54. A power distribution system comprising:
a power regulator for converting AC power to DC power and for providing DC power to a load;
a battery circuit coupled to the power regulator and the load, the battery circuit comprising a shunt coupled in series with a battery string, the battery circuit being operable to recharge by receiving DC power from the power regulator, the battery circuit also being operable to supply DC power to the load when there is an interruption of power from the power regulator; and
a battery monitoring system comprising a field measurement device and a monitor, wherein the field measurement device is located in close proximity to the battery circuit and wherein the monitor is located remotely from the field measurement device, the field measurement device being operative to receive current measurement data and including an analog-to-digital converter for digitizing the received current measurement data, the monitor including a first communicator for receiving digitized data from the field measurement device.

55. The system according to claim 54 wherein the shunt is coupled between a positive terminal of the power regulator and a positive terminal of the battery string.

56. The system according to claim 54 wherein the shunt is coupled between a ground terminal of the battery string and a system grounding point.

57. A power distribution system comprising:
a power regulator for converting AC power to DC power and for providing DC power to a load;
a battery circuit coupled to the power regulator and the load, the battery circuit being operable to recharge by receiving DC power from the power regulator, the battery circuit also being operable to supply DC power to the load when there is an interruption of power from the power regulator; and
a battery monitoring system comprising a field measurement device and a monitor, wherein the field measurement device is located in close proximity to the battery circuit and wherein the monitor is located remotely from the field measurement device, the field measurement device being operative to receive current measurement data and including an analog-to-digital converter for digitizing the received current measurement data, the field measurement device further comprising a power supply for receiving an input voltage from the battery and for providing an output voltage for at least one component within the field measurement device, the monitor including a first communicator for receiving digitized data from the field measurement device.

58. The power distribution system according to claim 57 wherein the at least one component is selected from a set that includes a controller, a second communicator, and an analog-to-digital converter.

59. The power distribution system according to claim 58 wherein the field measurement device further comprises a controller for providing control signals to the analog-to-digital converter and a second communicator for transmitting the digitized data from the field measurement device to the monitor, and wherein the controller is further operable to provide control signals to the second communicator.

60. A power distribution system comprising:
a power regulator for converting AC power to DC power and for providing DC power to a load;
a battery circuit coupled to the power regulator and the load, the battery circuit being operable to recharge by receiving DC power from the power regulator, the battery circuit also being operable to supply DC power to the load when there is an interruption of power from the power regulator; and
a battery monitoring system comprising a field measurement device and a monitor, wherein the field measurement device is located in close proximity to the battery circuit and wherein the monitor is located remotely from the field measurement device, the field measurement device being operative to receive current measurement data and including an analog-to-digital converter for digitizing the received current measurement data, the monitor comprising a shunt interface circuit that includes a first communicator, the first communicator being operative to receive digitized data from the field measurement device.

61. The system according to claim 60 wherein the shunt interface circuit further comprises a shunt interface controller.

62. The system according to claim 61 wherein the shunt interface controller filters readings from the field measurement device.

63. The system according to claim 60 wherein the field measurement device further comprises a second communicator for transmitting the digitized data from the field measurement device to the monitor.

64. The system according to claim 63 wherein the second communicator is operable to receive digitized data from a second field measurement device and is operable to transmit the digitized data from the second field measurement device to the monitor.

65. A power distribution system comprising:
a power regulator for converting AC power to DC power and for providing DC power to a load;
a battery circuit coupled to the power regulator and the load, the battery circuit being operable to recharge by receiving DC power from the power regulator, the battery circuit also being operable to supply DC power to the load when there is an interruption of power from the power regulator; and
a battery monitoring system comprising a field measurement device and a monitor, wherein the field measurement device is located in close proximity to the battery circuit and wherein the monitor is located remotely from the field measurement device, the field measurement device being operative to receive current measurement data and including an analog-to-digital converter for digitizing the received current measurement data, the monitor comprising a monitor CPU wherein the monitor is operable to execute an algorithm to determine if the field measurement device is measuring the float current of the battery circuit, the monitor including a first communicator for receiving digitized data from the field measurement device.

66. The system according to claim 65 wherein the algorithm requires the monitor CPU to compute a measurement value that represents the total power discharged from the battery.

67. The system according to claim 66 wherein the algorithm requires the monitor CPU to multiply the measurement value by a charge factor.

68. The system according to claim 67 wherein the charge factor is greater than or equal to the value one.

69. The system according to claim 65 wherein the field measurement device further comprises a second communicator for transmitting the digitized data from the field measurement device to the monitor.

70. The system according to claim 69 wherein the second communicator is operable to receive digitized data from a second field measurement device and is operable to transmit the digitized data from the second field measurement device to the monitor.

71. The system according to claim 65 wherein the monitor further comprises a shunt interface circuit that includes the first communicator.

72. The system according to claim 71 wherein the shunt interface circuit further comprises a shunt interface controller.

73. The system according to claim 72 wherein the shunt interface controller filters readings from the field measurement device.

74. The system according to claim 73 wherein the shunt interface controller passes the filtered digitized data to the monitor CPU.

* * * * *

UNITED STATES PATENT AND TRADEMARK OFFICE
CERTIFICATE OF CORRECTION

PATENT NO. : 6,498,491 B2
DATED : December 24, 2002
INVENTOR(S) : William R. Plow et al.

It is certified that error appears in the above-identified patent and that said Letters Patent is hereby corrected as shown below:

Column 3,
Line 34, delete "plurality of" (second occurrence)

Column 8,
Lines 9 and 13, replace "10" with -- 9 --

Column 9,
Line 47, replace "29" with -- 30 --

Signed and Sealed this

Twenty-eighth Day of June, 2005

JON W. DUDAS
*Director of the United States Patent and Trademark Office*